(12) United States Patent
Topacio

(10) Patent No.: US 12,148,715 B2
(45) Date of Patent: Nov. 19, 2024

(54) ELECTRONIC DEVICE INCLUDING A SUBSTRATE, A STRUCTURE, AND AN ADHESIVE AND A PROCESS OF FORMING THE SAME

(71) Applicant: ATI Technologies ULC, Markham (CA)

(72) Inventor: Roden Topacio, Springwater (CA)

(73) Assignee: ATI Technologies ULC, Thornhill (CA)

( * ) Notice: Subject to any disclaimer, the term of this patent is extended or adjusted under 35 U.S.C. 154(b) by 105 days.

(21) Appl. No.: 17/643,698

(22) Filed: Dec. 10, 2021

(65) Prior Publication Data
US 2023/0187379 A1    Jun. 15, 2023

(51) Int. Cl.
*H01L 23/00* (2006.01)

(52) U.S. Cl.
CPC ............ *H01L 23/562* (2013.01); *H01L 24/73* (2013.01); *H01L 2224/73204* (2013.01)

(58) Field of Classification Search
None
See application file for complete search history.

(56) References Cited

U.S. PATENT DOCUMENTS

| | | | | |
|---|---|---|---|---|
| 6,724,080 B1* | 4/2004 | Ooi | ........................ | H01L 23/36 |
| | | | | 257/E23.101 |
| 2010/0208442 A1* | 8/2010 | Asano | ............... | H01L 23/49822 |
| | | | | 361/783 |
| 2012/0188721 A1 | 7/2012 | Ho et al. | | |
| 2014/0084439 A1* | 3/2014 | Ihara | ...................... | H01L 23/562 |
| | | | | 438/118 |
| 2018/0261554 A1* | 9/2018 | Huang | .................... | H01L 23/04 |
| 2021/0235596 A1* | 7/2021 | Uppal | .................... | H01L 23/562 |

OTHER PUBLICATIONS

"Shore A Hardness Scale Cross References"; available at https://www.scribd.com/document/413791778/Shore-Hardness-Scales; Scribd, Inc.; p. 1 (2021).

* cited by examiner

*Primary Examiner* — Bo B Jang
(74) *Attorney, Agent, or Firm* — Patterson + Sheridan, LLP

(57) ABSTRACT

An electronic device includes a substrate, an electronic component, a structure, and an adhesive. The substrate has a proximal surface. The electronic component includes at least one die, wherein the electronic component is attached to the substrate. The structure has a proximal surface adjacent to proximal surface of the substrate. A feature extends from the proximal surface of the structure or the substrate, and the adhesive contacts the feature and the proximal surfaces of the structure and the substrate. In another aspect, a process of forming the electronic device can include applying the adhesive, placing the substrate and structure adjacent to each other, wherein the adhesive contacts the feature and the proximal surfaces of the substrate and the substrate, and curing the adhesive.

16 Claims, 8 Drawing Sheets

ELECTRONIC DEVICE INCLUDING A SUBSTRATE, A STRUCTURE, AND AN ADHESIVE AND A PROCESS OF FORMING THE SAME

FIELD OF THE DISCLOSURE

The present disclosure relates to electronic devices and processes, and more particularly to electronic device including substrates, structures, and adhesives and processes of forming the same.

RELATED ART

A flip chip die can be attached to a substrate. The substrate may need a stiffening ring to increase mechanical strength. The stiffening ring is attached to the substrate with an adhesive. More specifically, surfaces of the substrate and the stiffening ring are planar, and the adhesive has a uniform thickness between the substrate and the stiffening ring. The adhesive may not have sufficient adhesion to keep the stiffening ring or the substrate attached to the adhesive. Making the substrate and stiffening ring wider increases the size of the electronic device which is undesired.

SUMMARY OF THE DESCRIBED EMBODIMENTS

In an aspect, an electronic device includes a substrate having a proximal surface; an electronic component including at least one die, wherein the electronic component is attached to the substrate; a structure having a proximal surface adjacent to proximal surface of the substrate; and an adhesive. A feature extends from the proximal surface of the structure or the substrate, and the adhesive contacts the feature and the proximal surfaces of the structure and the substrate.

In an embodiment, from a bottom view of the structure, the feature has a circular shape or an elliptical shape.

In another embodiment, from a bottom view of the structure, the feature has a polygonal shape.

In still another embodiment, the feature includes an opening having a depth of at least 20 microns as measured from the proximal surface of the structure and in a direction perpendicular to the proximal surface of the structure.

In a further embodiment, the feature includes a trench adjacent to the proximal surface of the structure, wherein a length of the trench is at least 50% of a length of an outer peripheral edge of the structure.

In another embodiment, a thickness of the structure, as measured in a direction perpendicular to the proximal surface of the structure, is in a range from 0.3 mm to 2 mm.

In yet another embodiment, the feature is an opening having a depth of at least 20% of a thickness of the structure.

In still another embodiment, the feature is opening, the opening includes a void in contact with the adhesive, the void is spaced apart from the proximal surface of the structure.

In a further embodiment, at least 50% of a composition of the structure is a metal or a metal alloy that is in contact with the adhesive.

In a particular embodiment, the structure includes stainless steel.

In another particular embodiment, in a finished device, the adhesive has a Shore D hardness less than 90.

In another embodiment, the feature is an opening within the structure, the opening has a first width at a first elevation from the proximal surface of the structure and a second width at a second elevation from the proximal surface of the structure, the proximal surface of the structure is closer to the first elevation than to the second elevation, and the first width is less than the second width.

In another aspect, a process of forming electronic device includes applying an adhesive to a proximal surface of a substrate or to a proximal surface of a structure, wherein an electronic component includes at least one die, wherein the electronic component is attached to the substrate, and a feature extends from the proximal surface of the structure or the substrate. The process further includes placing the substrate and structure adjacent to each other, wherein the adhesive contacts the feature and the proximal surfaces of the substrate and the substrate; and curing the adhesive.

In an embodiment, the feature is an opening in the structure, applying the adhesive includes applying the adhesive to the proximal surface of the substrate, and placing the substrate and structure adjacent to each other includes moving one or both of the substrate and the structure closer to each other, wherein the adhesive flows into the opening.

In another embodiment, curing the adhesive includes thermally curing the adhesive.

In a further embodiment, after curing the adhesive, the adhesive has a Shore D hardness of less than 90.

In a particular embodiment, the structure includes stainless steel.

In a further aspect, an electronic device includes a substrate including an electrical conductor and a resin material at a surface and an electronic component including at least one die, wherein the electronic component is attached to the surface of the substrate and electrically coupled to the electrical conductor within the substrate. The electronic device further includes a structure having a proximal surface adjacent to the substrate, wherein the structure is at least part of a stiffening ring or a lid, at least 50% of a composition of the structure is a metal or a metal alloy, and the structure has a shape that defines an opening extending from the proximal surface to a location farther from the proximal surface, and an adhesive contacting the resin material of the substrate and the proximal surface of the structure and extending into the opening of the structure, wherein the adhesive has a Shore D hardness of less than 90.

In an embodiment, the structure includes stainless steel.

In a particular embodiment, the adhesive includes polydimethylsiloxane.

BRIEF DESCRIPTION OF THE DRAWINGS

Embodiments are illustrated by way of example and are not limited in the accompanying figures.

Figure 1:
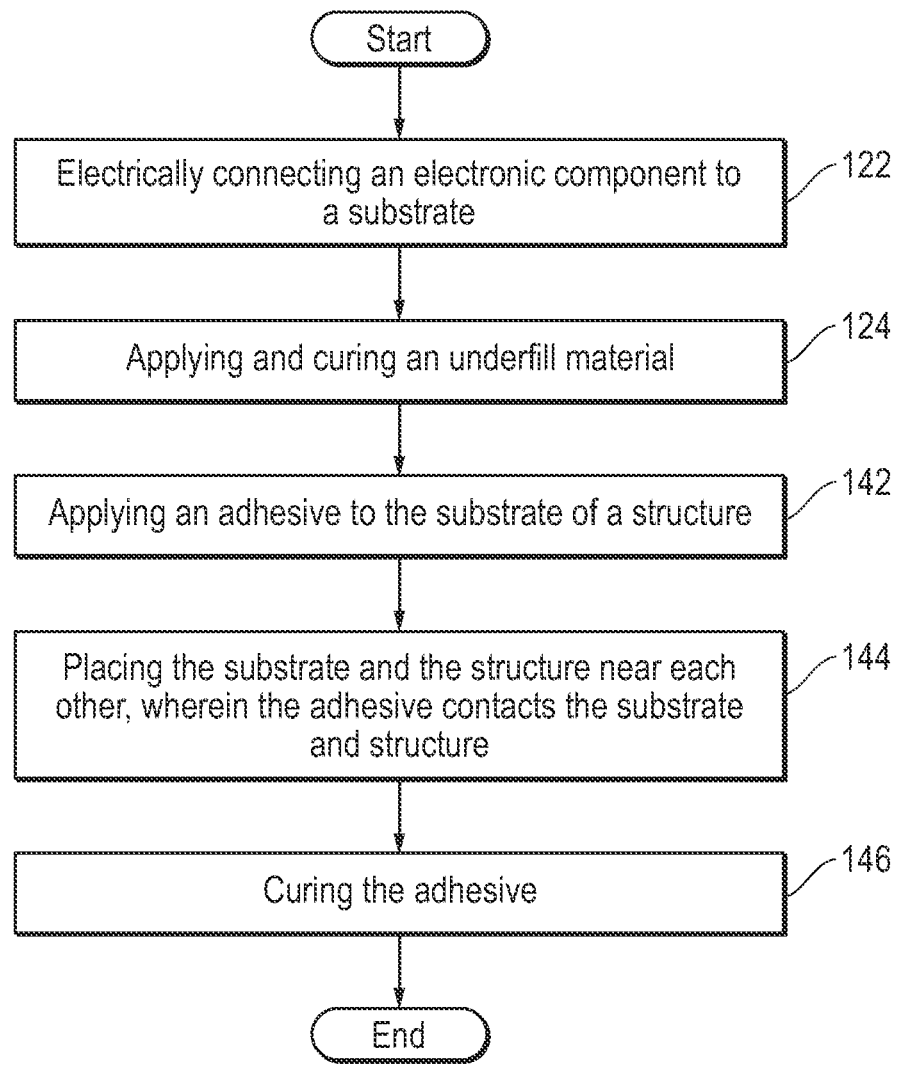
FIG. 1 includes a flow diagram of a process to manufacture an electronic device.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

The term "electrically coupled" is intended to mean a connection, linking, or association of two or more electronic components, circuits, systems, or any combination of: (1) at least one electronic component, (2) at least one circuit, or (3) at least one system in such a way that a signal (e.g., current, voltage, or optical signal) may be partially or completely transferred from one to another. A non-limiting example of "electrically coupled" can include an electrical connection between two electronic components. In a circuit diagram, a node corresponds to an electrical connection between the electronic components. Thus, an electrical connection is a specific type of electrical coupling; however, not all electrical couplings are electrical connections. Other types of electrical coupling include capacitive coupling, resistive coupling, and inductive coupling.

The term "width" is intended to mean a dimension as measured across a surface of a substrate or a structure. When the substrate or structure has dissimilar dimensions along the surface, the larger dimension is the length, and the smaller dimension is the width. When the dimensions along the surface are the same (for example, a square) or uniform (for example, a diameter of a circle), such dimensions are referred to herein as widths. For dimensions that can be characterized by a minor axis and a major axis (for example, an elliptical-shaped or oval-shaped substrate), the minor axis corresponds to a width, and the major axis corresponds to a length. Height and thickness of a layer, the substrate or the structure, or other feature associated with the substrate is measured in a direction perpendicular to the surface.

Unless explicitly stated to the contrary, the terms "horizontal," "lateral," and their variants are in a direction parallel to a primary surface of a substrate or structure, and the terms "vertical" and its variants are in a directions perpendicular to a primary surface of a substrate or a semiconductor layer.

The terms "on," "overlying," and "over" may be used to indicate that two or more elements are in direct physical contact with each other. However, "over" may also mean that two or more elements are not in direct contact with each other. For example, "over" may mean that one element is above another element, but the elements do not contact each other and may have another element or elements in between the two elements.

The terms "comprises," "comprising," "includes," "including," "has," "having," or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read such that the plurals include one or at least one and the singular also includes the plural, unless it is clear that it is meant otherwise. For example, when a single item is described herein, more than one item may be used in place of a single item. Similarly, where more than one item is described herein, a single item may be substituted for that more than one item.

The use of the word "about," "approximately," or "substantially" is intended to mean that a value of a parameter is close to a stated value or position. However, minor differences may prevent the values or positions from being exactly as stated. Thus, differences of up to ten percent (10%) for the value are reasonable differences from the ideal goal of exactly as described. When values of a parameter are significantly different, such values are more than 10% different. When values of a parameter are different (e.g., less than, greater than, a numerical difference between values, or the like) and within manufacturing tolerances for commercial production are insignificantly different.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A structure, such as a stiffening ring, lid, or the like, is used in many semiconductor packages that include an electronic component and a substrate. The electronic component includes at least one die or can be a module that includes more than one die. An adhesive is used to attach the structure to the substrate. Designs, as described below, provide features that help improve adhesion between the adhesive and the structure or the substrate. The features can be openings or protrusions extending from a proximal surface of the structure or the substrate. The features increase surface contact area between the adhesive and structure or substrate without increasing the overall size of the electronic device.

After reading this specification, skilled artisans will be able to determine (1) the depth (for an opening, as measured in a direction perpendicular to the proximal surface) or the height (for a protrusion, as measured in a direction perpendicular to the proximal surface) and (2) number of features that can be used to achieve a desired or minimum adhesion strength. For example, a skilled artisan can use a pull test to determine if the adhesion strength. The (1) depth or height of the features and (2) the number of features, or both (1) and (2) can be changed, such that the force (from the pull test) that results in delamination is at or above a minimum value, at or below a maximum value, or within 10% of a desired value. If the value of the force from the pull test is too low, more or deeper openings may be used or more or higher (increased heights of) protrusions may be used, and if the value of the force from the pull test is too high, fewer or shallower openings may be used or fewer or shorter (reduced heights of) protrusions may be used.

Figure 2:
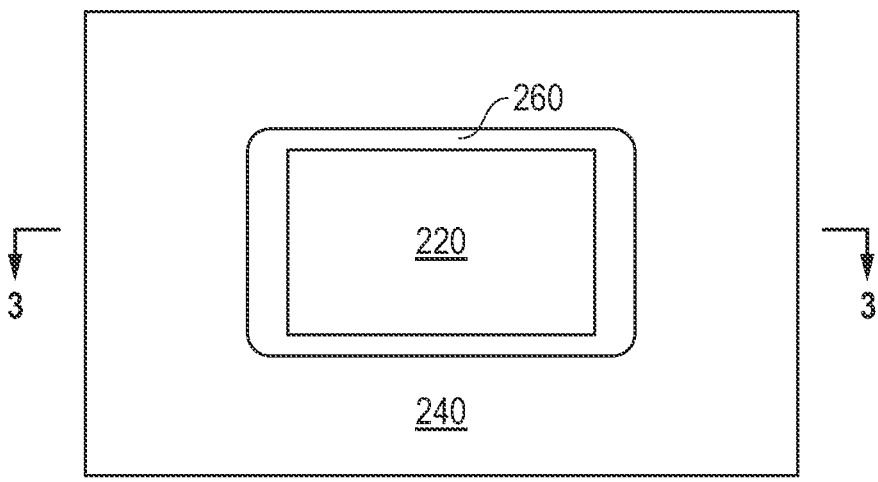
FIG. 2 includes an illustration of a top view of the electronic device including an electronic component, a substrate and an underfill material.
Figure 3:
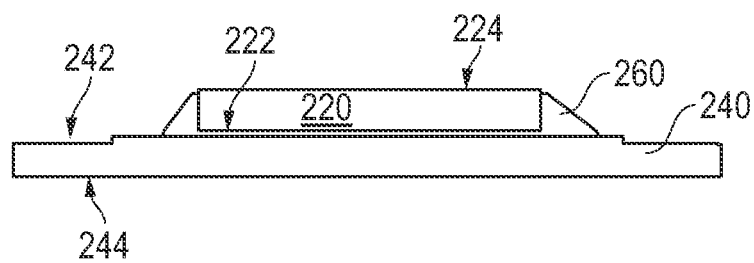
FIG. 3 includes an illustration of a cross-sectional view of the electronic device along sectioning line 3-3 in FIG. 2.

FIG. 1 includes a flow diagram of a process of manufacturing an electronic device. The process includes electrically connecting an electronic component to a substrate at block 122 and applying and curing an underfill material at block 124. FIGS. 2 and 3 include a top view and a cross-sectional view of an electronic device after preforming the acts in blocks 122 and 124 of FIG. 1. FIG. 3 illustrates the electronic device along sectioning line 3-3 as seen in FIG. 2.

Referring to FIGS. 2 and 3, electronic device includes an electronic component 220 and a substrate 240. The electronic component 220 has a proximal surface 222 closer to the substrate 240 and a distal surface 224 opposite the proximal surface 222. The substrate 240 has a proximal surface 242 closer to the electronic component 220 and a distal surface 244 opposite the proximal surface 242.

The electronic component 220 includes at least one die. In an embodiment, the electronic component can be a single die, and more particularly, may be a microprocessor, a microcontroller, a graphics processing unit (GPU), a digital signal processor (DSP), a memory device, or the like. In another embodiment, the electronic component can be a module that includes at least two dies. In a particular embodiment, one of the dies may be a microprocessor that has a processor and a Level 1 (L1) cache, and the other die may be a memory device that includes a Level 2 (L2) cache. The dies can be electrically coupled to each other within the module. Many other combinations of different dies, including more than two dies, can be used within the module and are not limited to only to the embodiment described.

The substrate 240 includes a base material and electrical conductors. The base material is non-metallic material that is an electrically insulating or a resistive material. The substrate 240 has sufficient thermal conductivity to allow heat to dissipate. In an embodiment, the base material the substrate 240 can be resin material, such as Bismaleimide-Triazine (BT) epoxy or epoxy-filled fiberglass or an epoxy including filler particles that include silica, alumina, AN, BN, or the like. The electrical conductors in the substrate 240 can include one or more levels of interconnects, conductive plugs between different levels of interconnects, through-substrate vias (TSVs), or a combination thereof. In an embodiment, the substrate 240 can be an interposer. In another embodiment, the substrate 240 further includes active components that are part of a circuit near the proximal surface 242 of the substrate 240.

The electronic component 220 is electrically connected to the substrate 240 along the proximal surface 222 of the electronic component 220 that is adjacent the proximal surface 242 of the substrate 240. The electronic component 220 can have bond pads and may have TSVs extending through a die substrate of a die within the electronic component 220, and the substrate 240 can have leads and may have TSVs extending through the substrate 240. Conductive bumps or solder balls (not illustrated) may be attached to the electronic component 220 or the substrate 240. After aligning the electronic component 220 and substrate 240 to each other, a thermal cycle is performed to flow the conductive bumps or solder balls to form the electrical connections between the electronic component 220 and the substrate 240. The electrical connections between the electronic component 220 and the substrate 240 allows power, data, and other signals from outside the electronic device to reach the electronic component 220 via the substrate 240.

After the electrical connections are made between the electronic component 220 and the substrate 240, an underfill material 260 is applied and cured. A portion of the underfill material 260 is disposed along the vertical surface surfaces of the electronic component 220, and another portion of the underfill material 260 is disposed between the proximal surface 222 of the electronic component 220 and the proximal surface 242 of the substrate 240. The underfill material 260 helps to improve mechanical integrity of the electronic device where electrical connections are made between the electronic component 220 and the substrate 240. The underfill material 260 is an electrical insulator. In an embodiment, the underfill material 260 can include an epoxy and may include filler particles that include silica, alumina, AN, BN, or the like.

A structure will be attached to substrate 240 using an adhesive. The structure can be in the form of a stiffening ring, a lid, or the like. Materials for the structure are briefly described before addressing the adhesive, as the material of the structure can affect the selection of the material for the adhesive. Many adhesives adhere more strongly to organic materials, glass, and ceramics as compared to metals and metal alloys. In an embodiment, at least 50% of a composition of the structure is a metal or a metal alloy. Metals and metal alloys that can be used for the structure include copper, aluminum, brass, nickel, stainless steel, or the like. Of these metallic materials, stainless steel can be particularly problematic. An adhesive that has sufficient adhesion to nickel has substantially less adhesion to stainless steel, and thus, the number of adhesives that can be used for stainless steel may be limited. As described below, the structure can be designed to allow for a wider selection of adhesive materials to be used.

Figure 4:
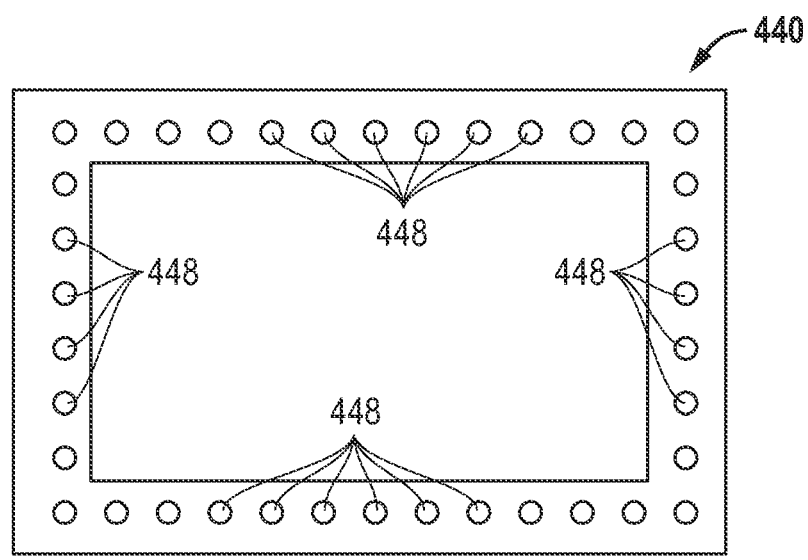
FIG. 4 includes an illustration of a bottom view of a structure with openings.

FIG. 4 includes an illustration of a bottom view for a structure 440. The structure 440 has a proximal surface 442 and a distal surface (not illustrated in FIG. 4) opposite the proximal surface 442. The proximal surface 442 of the structure 440 will be attached to the proximal surface 242 of the substrate 240 using an adhesive.

Features along the proximal surface 442 of the structure 440 help improve adhesion to an adhesive. The features described herein increase the surface area between the structure 440 and the adhesive without increasing the area occupied by the electronic device. In the embodiment illustrated in FIG. 4, the structure 440 is in the form of a stiffening ring. The stiffening ring has outer dimensions that are the same or within 10% of the outer dimensions of the substrate 240. The structure 440 has a thickness in a range of 0.3 mm to 2.0 mm. The structure 440 is made of a metal or a metal alloy, such as copper, aluminum, brass, nickel, stainless steel, or the like.

In the embodiment as illustrated, the structure 440 has a shape that defines openings 448 that extend from the proximal surface 442 to a location farther from the proximal surface 442. The openings 448 have circular shapes as seen in the FIG. 4. In other embodiments, other shapes can be used for the openings and are addressed later in this specification.

The openings 448 can extend partly or completely through the thickness of the structure 440. In an embodiment, the openings 448 have a depth of at least 20 microns. In the same or different embodiment, the openings 448 can have a depth that is at most 90%, at most 70%, or at most 50% of the thickness of the structure 440. Thus, the depth of the openings 448 can be in a range of 20 microns to 50%, 70%, or 90% of the thickness of the structure 448.

Optionally, the proximal surface 442 of the structure 440 may be roughened; however, roughening alone may not provide sufficient adhesion. The structure 440 is relatively thin and fragile as compared to a relatively thicker block (e.g., over 1 cm thick) of the same material. Thus, roughening cannot be too aggressive without cause significant damage to the structure 440. When the structure 440 is roughened, the root mean square (rms) roughness of the proximal surface 442 is less than 10 microns, and many times, the rms roughness is at most only a few (e.g., less than 3) microns. The depths and thickness previously described (at least 20 microns) can be sufficient to allow more contact surface area between the structure 440 and the adhesive.

The openings 448 can be formed using a variety of different techniques. In an embodiment, the structure 440 can be stamped using a stamping die having a complementary shape to the desired shape along the proximal surface 442 of the structure 440. For circles, the stamping die includes protrusions that have circular shapes that extend away from a body of the stamping die. Other stamping die patterns can be used to achieve shapes described later in this specification. In another embodiment, the openings 448 can be formed by drilling the openings 448. In a further embodiment, a laser ablation or an etching technique can be used to form the openings 448.

Figure 5:
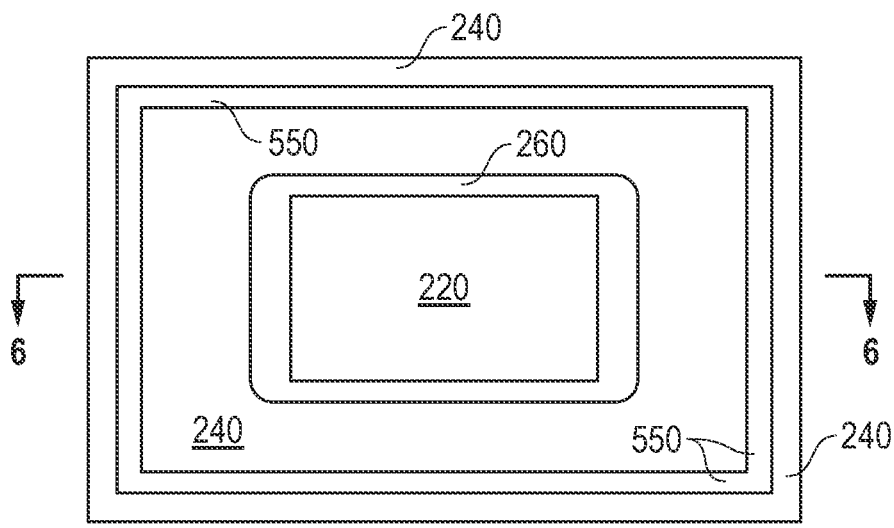
FIG. 5 includes a top view of the electronic device of FIG. 2 after applying an adhesive to the substrate.
Figure 6:
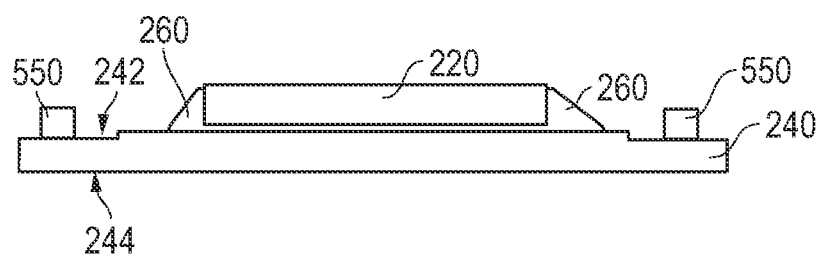
FIG. 6 includes a cross-sectional view of the electronic device along sectioning line 6-6 in FIG. 5.

Referring to FIG. 1, the process further includes applying an adhesive to the proximal surface of the substrate or the structure at block 142. As illustrated in FIGS. 5 and 6, the adhesive is applied to the substrate 240. FIG. 6 includes a cross-sectional view along the sectioning line 6-6 in the top view illustrated in FIG. 5. In another embodiment, the adhesive 550 can be applied to the structure 440 instead of the substrate 240. Table 1 includes a list of adhesive material families and their corresponding hardnesses. More than one adhesive compound is within each family.

TABLE 1

Adhesive Material Families and Corresponding Hardnesses

| Adhesive Material family | Hardness (after curing) |
| --- | --- |
| Polyacrylic | 40 to 90 Shore A |
| Polyurethane | 80 to 95 Shore A |
| Cyanoacrylate | 85 to 90 Shore A |
| Polydimethylsiloxane | 95 Shore A |
| Epoxy-Flexible | 35 to 60 Shore D |
| Epoxy-Rigid | 70 to 90 Shore D |

Ideally, all adhesive materials listed above should be able to be used for the adhesive 550. However, as previously described, some adhesive materials do not have good adhesion to materials used for the structure 440, particularly, when a metal or metal alloy is along the proximal surface 442 of the structure 440. When all of the structure 440 is made solely of a metal or metal alloy, such metal or metal alloy is along all surfaces, including the proximal surface 442 of the structure 440.

When adhesion to the structure 440 is too low, an adhesive material with a greater hardness can be used; however, an assembly facility needs to stock more different adhesion materials in inventory. As the number of adhesive materials used in the assembly facility increases, the likelihood of misprocessing increases. For example, a less adhesive material may be inadvertently used when a more adhesive material is needed. One or more other commercial reasons may also disfavor using a more elastic adhesive material when it can be avoided.

The design of structure 440, as previously described, and other designs described later in this specification can help to allow a softer adhesive material to be used in applications where a harder adhesive material would otherwise be needed in the absence of the designs. Many times, the area occupied by the combination of the substrate 240 and the structure 440 cannot be increased in view of a particular application. For example, the combination of the substrate 240 and the structure 440 is subsequently attached to a socket on a printed wiring board. The size of the socket does not allow the area occupied by the combination of the substrate 240 and the structure 440 to be increased.

Figure 7:
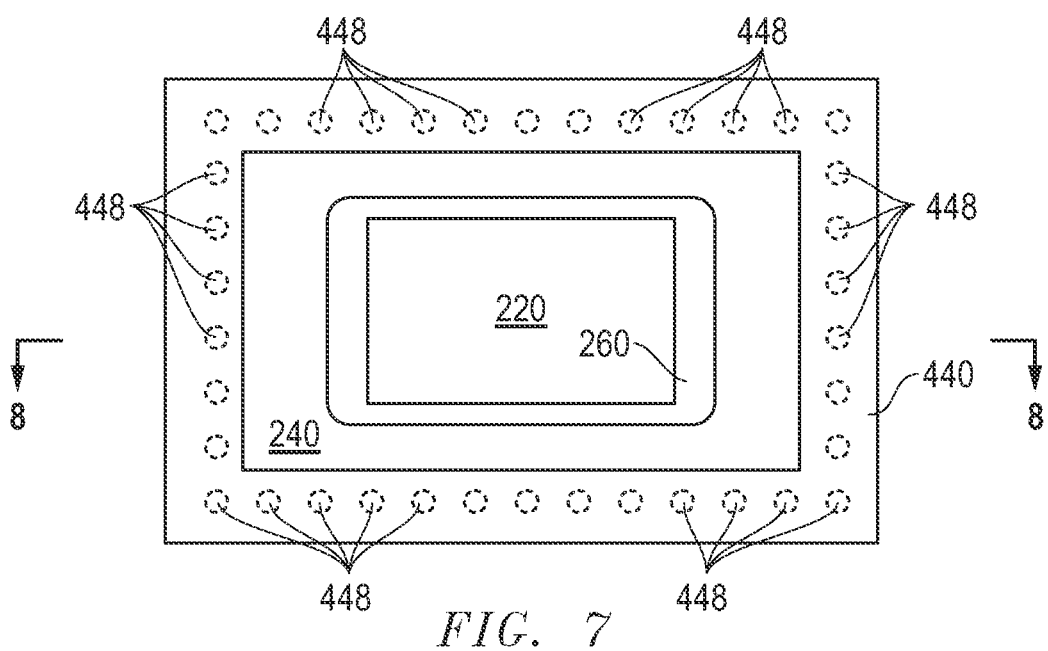
FIG. 7 includes a top view of a portion of the electronic device of FIG. 5 after placing the structure adjacent to the substrate and curing the adhesive.
Figure 8:
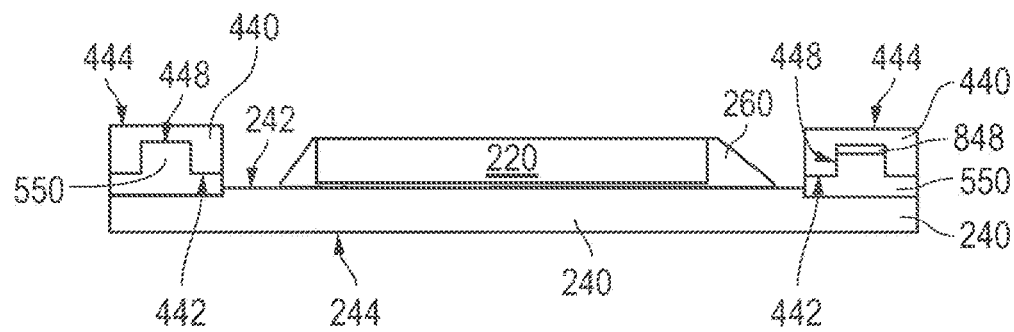
FIG. 8 includes a cross-sectional view of the portion of the electronic device along sectioning line 8-8 in FIG. 7.

Referring to FIGS. 1, 7, and 8, the process further includes placing the substrate and the structure near each other, wherein the adhesive contacts the substrate and structure at block 144 and curing the adhesive at block 146. Placing the substrate 220 and structure 440 adjacent to each other includes moving either or both of the substrate 240 and the structure 440 closer to each other, wherein the adhesive 550 contacts the proximal surface 442 of the structure 440 and flows into the openings 248.

The curing of the adhesive 550 depends on the type of adhesive material, and the maker of the adhesive material provides instructions on how to cure the adhesive material. In an embodiment, curing can be performed at room temperature (in a range from 20° C. to 25° C.). In another embodiment, the adhesive can be thermally cured at a temperature higher than room temperature, such as in a range from 50° C. to 250° C. In the same or a different embodiment, the curing can be performed for a time period from 5 minutes to 5 hours. Other temperatures and time periods may be used if needed or desired. In another embodiment, the adhesive 550 can be cured using light, such as ultraviolet (UV) light or visible light. In the same or a different embodiment, UV curing can be performed for a time period from 5 seconds to 5 minutes. Other time periods for UV curing may be used if needed or desired.

FIG. 7 illustrates a top view of the electronic device after curing is performed, and FIG. 8 includes a cross-sectional view along sectioning lines 8-8 in FIG. 7. The openings 448 within the structure 440 increase the contact surface area between the structure 440 and the adhesive 550 without increasing the area occupied by the structure 440 or the substrate 240. Thus, the outer dimensions of the structure 440, the substrate 240, or both are not increased to improve adhesion between the structure 440 and the adhesive 550.

In the embodiment illustrated, an opening 448 is completely filled with the adhesive 550, and another opening is partly, but not completely filed with the adhesive 550. In such an opening, a void 848 can be a region within the opening 448 where air or another gas became trapped within the opening 448, thus, creating a void 848. The void 848 can be present and still have improved adhesion because of the increased contact area with the adhesive 550 along the walls of the openings 448 of the structure 440.

Figure 9:
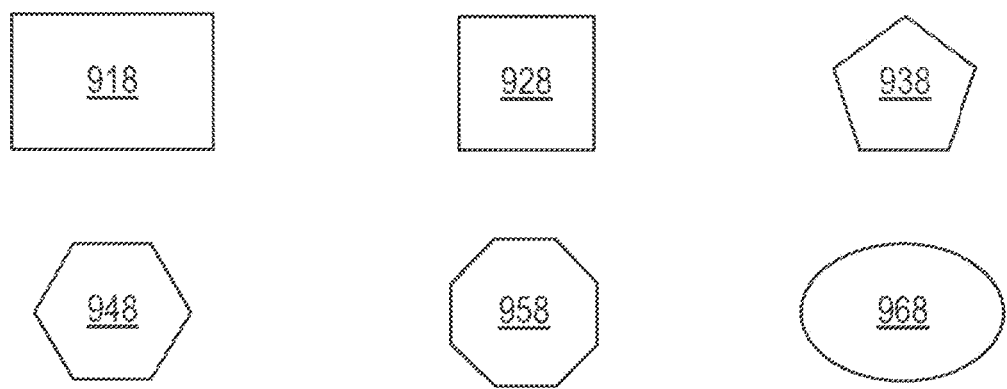
FIG. 9 includes shapes that can be used in conjunction with or as a replacement to the openings as illustrated in FIG. 4.

Other designs for the structure can be used without deviating from the concepts described herein. FIG. 9 includes other shapes that can be used for in place of or in conjunction with the openings 448. FIG. 9 includes the shapes as they would be seen along the bottom surface of the structure. Polygonal shapes can also be used. An opening 918 has a rectangular shape (not a square), an opening 928 has a square shape, an opening 938 has a pentagonal shape, an opening 948 has a hexagonal shape, and an opening 958 has an octagonal shape. Other polygonal shapes can be used without deviating from the concepts described herein. Further, other openings can have shapes are not polygonal. In an embodiment, an opening 968 has an elliptical shape. The rounded shapes of openings 448 and 968 do not have corners, and thus, are less likely to have burs or sharp edges as compared to the polygonal shapes.

Figure 10:
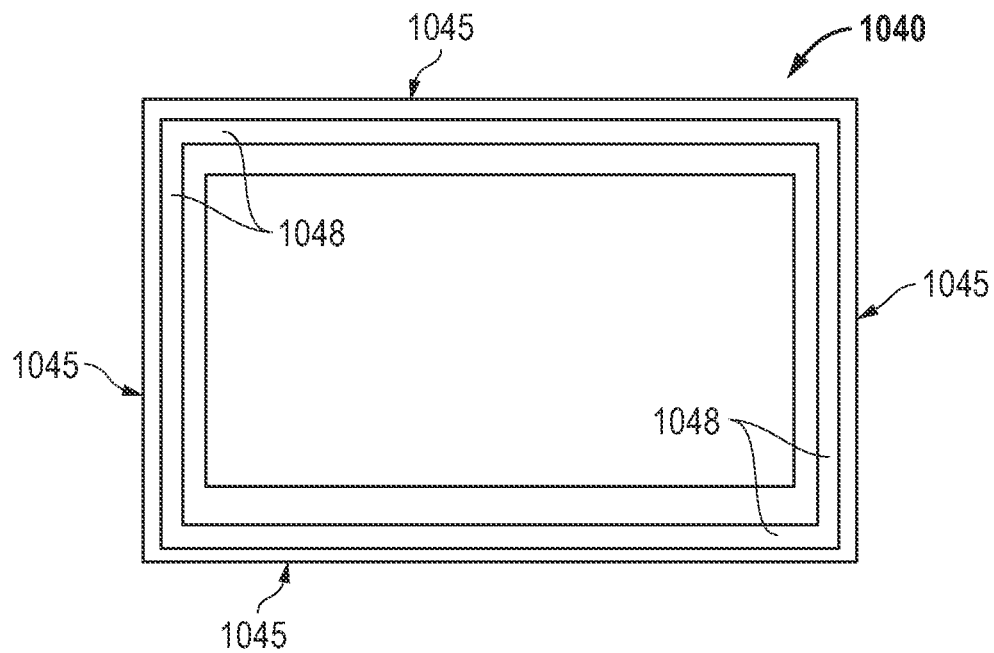
FIG. 10 includes an illustration of a bottom view of a structure where the opening is in the form of a trench.
Figure 11:
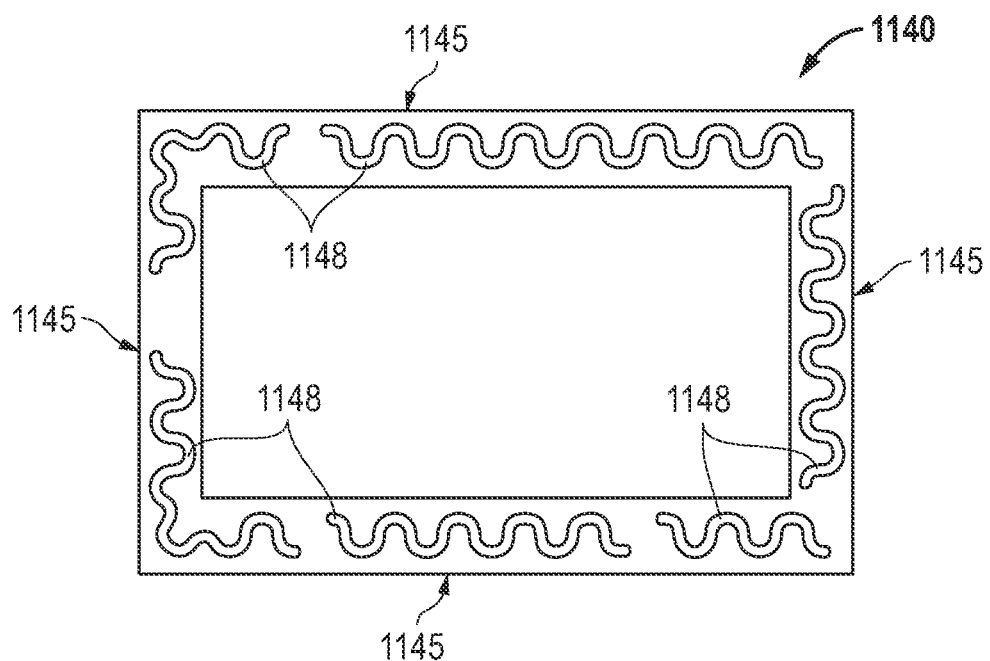
FIG. 11 includes an illustration of a bottom view of a structure where the opening is in the form of trenches having serpentine shapes.

In another set of embodiments, the openings 448 can be replaced by a trench, which is a type of opening. FIG. 10 illustrates a bottom view of a structure 1040 has a shape that defines a trench 1048. In the embodiment illustrated in FIG. 10, the length segments of the trench 1048 are parallel to the outer edges 1045 of the structure 1040. In a further embodiment illustrated in FIG. 11, the structure 1140 defines trenches 1148 having serpentine patterns. The rounded shape of the trench 1148 does not have corners, and thus, is less likely to have burs or sharp edges. The trenches 1148 extend along lengths that are parallel to the outer edges 1145 of the structure 1140.

In further embodiments, other designs of trenches may be used. For example, the trench 1048 in FIG. 10 is a single trench that lies adjacent to the periphery of the structure 1040. The trench 1048 can be replaced shorter trenches, where any or all of such shorter trenches extend across corners or do not extend across the corners. Similarly, the trenches 1148 can be replaced by a single trench, similar to trench 1040 except the trench would have a serpentine pattern. Lengths of one or more of the previously described trenches are at least 50% of a length of an outer peripheral edge of the structure. The trench 1048 and trenches 1148 can have any of the depths as previously described with respect to the openings 448.

Figure 12:
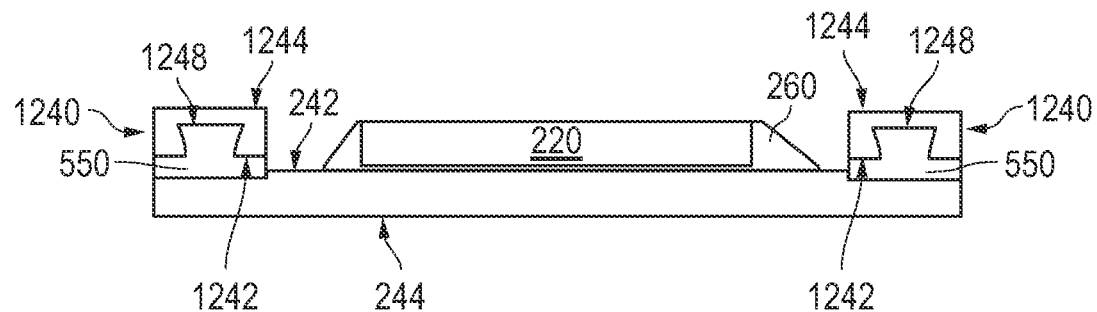
FIG. 12 includes an illustration of a cross-sectional view of an electronic device having a structure where the opening is in the form of a trench having a dovetail shape.

In a further embodiment, an opening can have a portion lying at an elevation closer to the proximal surface that has a width that is less than a portion of the opening lying at an elevation farther from the proximal surface. FIG. 12 includes a cross-sectional view of a structure 1240 having a shape that defines a trench 1248, where the trench 1248 has a dovetail shape. The trench 1248 includes a portion at an elevation closer to the proximal surface 1242 of the structure 1240 that is narrower than a portion at an elevation farther from the proximal surface 1242 of the structure 1240. A similar relationship may be specified with respect to the distal surface 1244 of the structure 1240 (relatively wider near the distal surface 1244 and relatively narrower farther from the distal surface 1244). The trench 1248 can be formed using a router bit to achieve the dovetail shape. Adhesive 550 can flow into the trench 1248, and due to the dovetail shape, after the adhesive 550 is cured, more force is needed to separate the adhesive and the structure 1240, as compared to the structure 1040 having the trench 1048.

Figure 13:
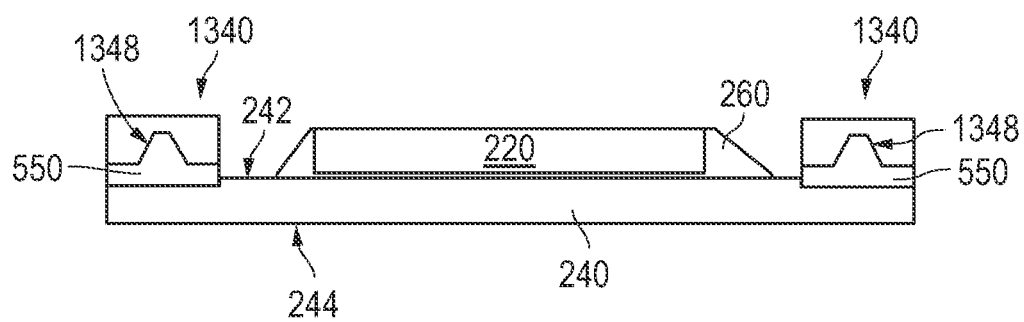
FIG. 13 includes an illustration of a cross-sectional view of an electronic device having a structure where the openings have beveled surfaces.

In another embodiment, the opening can have a portion lying at an elevation the closer to the proximal surface of the structure that has a width that is greater a portion of the opening lying at an elevation farther from the proximal surface of the structure. FIG. 13 includes a cross-sectional view of a structure 1340 that has openings 1348 with beveled surfaces. As compared to other openings previously described, the force needed to separate the structure 1340 from an adhesive will be lower than the structure 440; however, the structure 1340 having the openings 1348 is better than another structure without any openings, even if such other structure has a roughened proximal surface.

Figure 14:
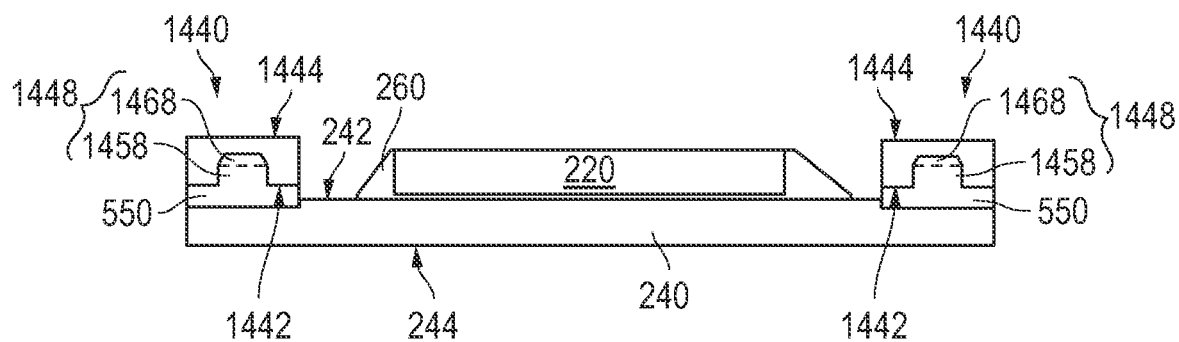
FIG. 14 includes an illustration of a cross-sectional view of an electronic device having a structure where the openings have wider portions and tapered portions.

FIG. 14 illustrates another embodiment, in which a structure 1440 has openings 1448, each having a wider portion 1458 closer to a proximal surface 1442 and a tapered portion 1468 closer to a distal surface 1444.

Figure 15:
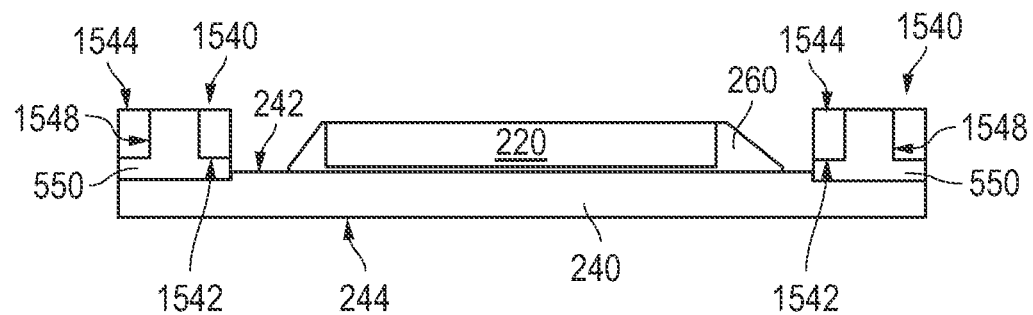
FIG. 15 includes an illustration of a cross-sectional view of en electronic device having a structure where the openings extend through all of the thickness of the structure.

FIG. 15 includes a cross-sectional view of a structure 1540 where openings 1548 extend through all of the thickness of the structure 1540. Thus, the openings 1548 extend from a proximal surface 1542 to a distal surface 1544 of the structure 1540. The shape of the openings 1548 can help to reduce the likelihood of forming a void within the openings 1548.

Figure 16:
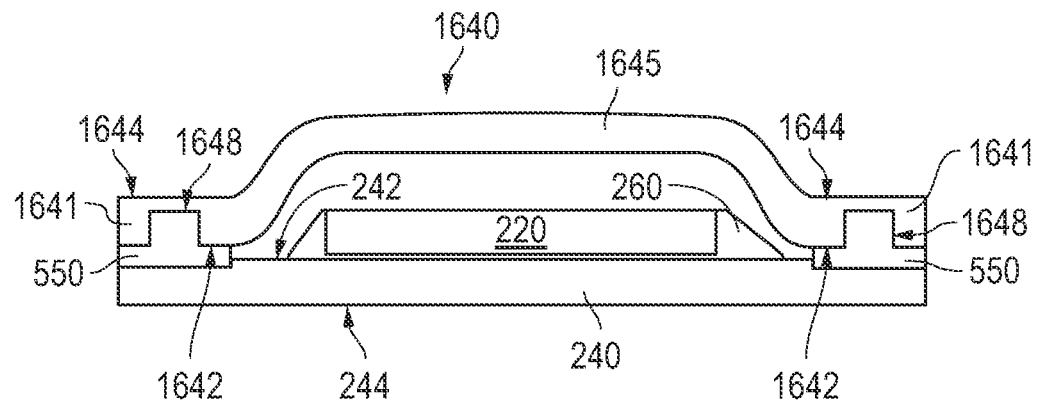
FIG. 16 includes an illustration of a cross-sectional view of an electronic device having a structure in the form of a lid.

The structure can be in the form of a lid that covers the electronic component 220. FIG. 16 includes a cross-sectional view of a structure 1640 in the form of a lid. The structure includes a flange 1641 and a main body 1645. The flange 1641 has a proximal surface 1642 and a distal surface 1644. The structure 1640 has a shape that defines openings 1648 that are the same as the openings 448. In another embodiment, the openings 1648 can be replaced by any of the previously described openings.

Figure 17:
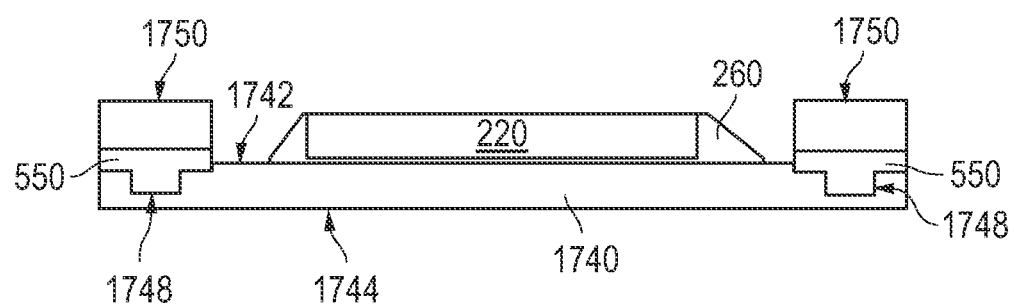
FIG. 17 includes an illustration of a cross-sectional view of an electronic device having a substrate with openings.

Adhesion issues are not necessarily limited to the structure. Depending on the materials of the substrate and adhesive, adhesion between the substrate and the adhesive can be insufficient. FIG. 17 includes a substrate 1740 having a proximal surface 1742 and a shape that defines openings 1748. The openings 1748 can have any of the shapes previously described. When openings are being defined within the substrate 1740, care should be exercised to avoid contacting an interconnect or an electrically conductive feature within a redistribution layer that is within the substrate 1740. The substrate 1740 and the structure 240 are moved close to each other. The adhesive 550 contacts the proximal surface 1742 of the substrate 1740 and the proximal surface of the structure 1750, and the adhesive 550 flows into the openings 1748. In the embodiment illustrated in FIG. 17, the structure 1750 does not have any openings; however, in another embodiment, the structure 1750 can be replaced by any of the previously described structures.

Previously discussed designs have features that include openings that extend from a proximal surface into the structure or substrate. In another set of embodiments, mirror images of the previously described designs may be used.

Figure 18:
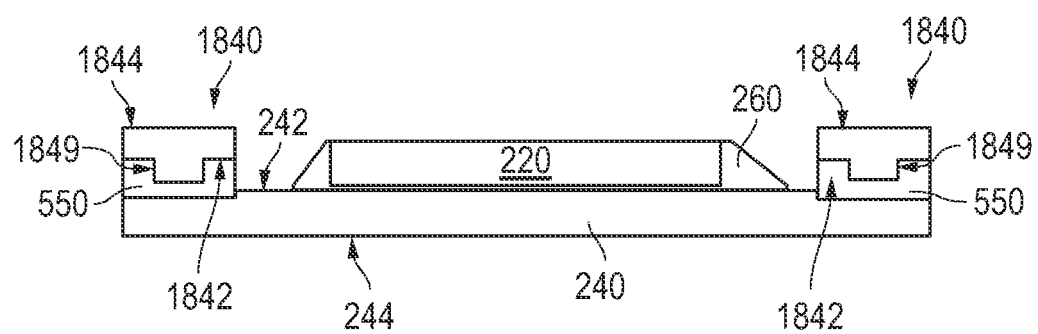
FIG. 18 includes an illustration of a cross-sectional view of an electronic device having a structure that includes protrusions extending from a proximal surface.

Thus, the features can be protrusions rather than or in addition to openings. For example, instead of openings that extend from a proximal surface toward a distal surface, protrusions can extend from the proximal surface of a structure or a substrate in a direction away from a distal surface of the same structure or same substrate. FIG. 18 includes a cross-sectional view of a structure 1840 that includes protrusions 1849 that extend from the proximal surface 1842 in a direction away from the distal surface 1844. In the same or different embodiment, the protrusions 1849 can extend in a direction perpendicular to the proximal surface 1842. The protrusions 1849 can have any of the designs the openings as previously described except that the protrusions extend away from the proximal and distal surfaces of the structure instead of extending toward the distal surface of the structure.

Figure 19:
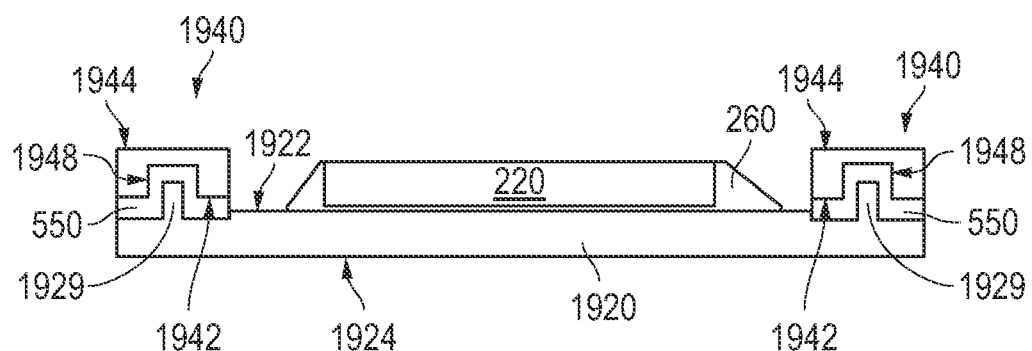
FIG. 19 includes an illustration of a cross-sectional view of an electronic device having a substrate that has complementary features.

In still another set of embodiments, the features can include complementary sets of openings and protrusions. FIG. 19 includes a cross-sectional view of a substrate 1920 and a structure 1940 that have complementary features, and more particularly, protrusions 1929 and openings 1948. The substrate 1920 has a proximal surface 1922, a distal surface 1924, and protrusions 1929. The protrusions 1929 extend from the proximal surface 1922 in a direction away from the distal surface 1924. The structure 1940 has a proximal surface 1942, a distal surface 1944, and openings 1948. The openings 1948 extend from the proximal surface 1942 in a direction toward the distal surface 1944. In a particular embodiment, the shapes of the protrusions 1929 and the openings 1948 can have similar shapes except that the protrusions 1929 are smaller than the openings 1948 to allow the protrusions and some of the adhesive 550 to extend into the openings 1948. After reading this specification, skilled artisans the protrusions and openings can have any of the shapes previously described, provided the shapes of the protrusions and openings complement one another.

Many different designs of openings are described. Other than the openings 1548, which extend through the entire thickness of the structure 1540, all other openings can have any of the depths as previously described with respect to the openings 448.

A specific example with materials may help with the understanding of the concepts described herein. The example demonstrates how a change in the design of a structure or a substrate can be changed to allow a particular adhesive to be used. The example is to illustrate the concepts described herein and not to limit the scope of the appended claims.

An electronic component includes a substrate and a structure and occupies an area that cannot be increased for a particular application. The structure is made of stainless steel and does not include any of the features previously described. Due to the area occupied by the structure, an adhesive with a Shore D hardness of at least 90 is needed. As can be seen in Table 1 above, very few adhesives have such a hardness. The structure 440 with openings 448 can replace the previously described structure. The structure 440 has sufficient adhesion to a polydimethylsiloxane adhesive (e.g., Dowsil SE4450™-brand adhesive available from Dow Chemical Company of Midland, MI, USA) that has a Shore D harness of 46 (equivalent to Shore A hardness of 95).

Another structure has the same dimensions as the stainless steel structure but does not have the features. The other structure is made of Ni-plated Cu, and therefore, nickel is long the exposed surfaces. Without any of the features previously described, the structure has sufficient adhesion with the polydimethylsiloxane adhesive. Thus, the same adhesive can be used for the Ni-plated Cu structure and the stainless steel structure having openings. If openings are used with the Ni-plated Cu structure, a significantly softer adhesive can be used. Further, depending on the number and designs of openings in either structure, even softer adhesives may be used. Thus, more of the adhesives as listed in Table 1 may now be used.

Embodiments described herein provide for sufficient adhesion for a more combinations of adhesive materials and materials of either or both of a structure or a substrate. The designs help to increase contact surface area between the adhesive and either or both of the structure or substrate without an increase of overall area occupied by the electronic device. Thus, more adhesive materials can be used for the adhesive when the features (openings or protrusions) are present in the structure, substrate, or both, as compared to an identical structure, substrate, or both without any of the features. The substrate or structure do not need to be increased in overall size for sufficient adhesion. The concepts described herein can be used with nearly all package types that have a structure, such as a stiffening ring or a lid.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device, comprising:
   a substrate;
   an integrated circuit die attached to a surface of the substrate;
   a structure having a first surface and a plurality of openings formed in the first surface to form respective cavities formed therein, wherein the first surface of the structure faces the surface of the substrate, wherein the openings are formed in a pre-determined pattern, and wherein the cavities are enclosed within the structure except for the openings formed in the first surface; and an adhesive disposed between the surface of the substrate and the first surface of the structure and within at least a portion of the cavities.

2. The electronic device of claim 1, wherein the openings include circular shaped openings formed in the first surface.

3. The electronic device of claim 1, wherein the openings include polygonal shaped openings formed in the first surface.

4. The electronic device of claim 1, wherein at least a subset of the openings are arranged in a linear row.

5. The electronic device of claim 1, wherein the openings include elliptically shaped openings in the first surface.

6. The electronic device of claim 1, wherein the openings are dimensioned to receive protrusions that extend from the surface of the substrate.

7. The electronic device of claim 1, wherein a depth of the cavities is at least 20% of a thickness of the structure.

8. The electronic device of claim 1, wherein the structure further has openings to the cavities through a second surface of the structure, opposite the first surface such that the cavities extend between the openings formed in the first surface and corresponding ones of the openings formed in the second surface.

9. The electronic device of claim 1, wherein at least 50% of a composition of the structure is a metal or a metal alloy that is in contact with the adhesive.

10. The electronic device of claim 1, wherein the openings have serpentine shapes.

11. The electronic device of claim 9, wherein the adhesive has a Shore D hardness less than 90 subsequent to curing.

12. An electronic device comprising:
a substrate;
an integrated circuit die attached to a surface of the substrate;
a structure having a surface that faces the surface of the substrate, wherein the surface of the structure has an elongated opening to an elongated cavity formed therein, wherein a cross-section of the elongated cavity has one of a trapezoid shape, and wherein the cavity is enclosed within the structure except for the elongated opening of the surface of the structure; and
an adhesive disposed between the surface of the substrate and the surface of the structure, and within the elongated cavity.

13. The electronic device of claim 12, wherein:
the cross-section of the elongated cavity has an isosceles trapezoid shape.

14. The electronic device of claim 13, wherein:
the opening through the surface of the structure corresponds to a first base of the isosceles trapezoid shape;
a distal surface of the cavity corresponds to a second base of the isosceles trapezoid shape; and
the first base is longer than the second base.

15. The electronic device of claim 13, wherein:
the opening through the surface of the structure corresponds to a first base of the isosceles trapezoid shape;
a distal surface of the cavity corresponds to a second base of the isosceles trapezoid shape; and
the first base is shorter than the first base.

16. An electronic device, comprising:
a substrate;
an integrated circuit die attached to a surface of the substrate;
a structure having first and second opposing surfaces, wherein the first surface faces the surface of the substrate, wherein the first and second surfaces of the structure have respective openings to a cavity formed therein, wherein the cavity extends between the first and second openings, and wherein the cavity is enclosed within the structure except for the openings of the first and second surfaces; and
an adhesive disposed between the surface of the substrate and the first surface of the structure, and within at least a portion of the cavity.

* * * * *